(12) United States Patent
Braley et al.

(10) Patent No.: US 10,129,976 B2
(45) Date of Patent: Nov. 13, 2018

(54) HIGH PERFORMANCE, ULTRA LOW LOSS, ULTRA LIGHTWEIGHT, MULTI-LAYERED RIGID CIRCUIT BOARDS

(71) Applicant: NORTHROP GRUMMAN SYSTEMS CORPORATION, Falls Church, VA (US)

(72) Inventors: Daniel J. Braley, Brea, CA (US); Eric G. Barnes, Rancho Palos Verdes, CA (US); Pedro Gonzalez, El Segundo, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 507 days.

(21) Appl. No.: 14/692,559

(22) Filed: Apr. 21, 2015

(65) Prior Publication Data

US 2016/0316556 A1 Oct. 27, 2016

(51) Int. Cl.
| | |
|---|---|
| *B29C 64/00* | (2017.01) |
| *H05K 1/09* | (2006.01) |
| *H05K 1/03* | (2006.01) |
| *H05K 3/46* | (2006.01) |
| *B33Y 80/00* | (2015.01) |
| *H05K 3/10* | (2006.01) |
| *B33Y 70/00* | (2015.01) |
| *B29C 64/106* | (2017.01) |

(Continued)

(52) U.S. Cl.
CPC ............. *H05K 1/09* (2013.01); *B29C 64/106* (2017.08); *B33Y 70/00* (2014.12); *B33Y 80/00* (2014.12); *H05K 1/032* (2013.01); *H05K 3/10* (2013.01); *H05K 3/4664* (2013.01); *B29K 2023/0666* (2013.01); *B29K 2305/00* (2013.01); *B29L 2031/3425* (2013.01); *H05K 1/0393* (2013.01); *H05K 3/1241* (2013.01); *H05K 2201/0129* (2013.01); *H05K 2201/0158* (2013.01); *H05K 2203/0126* (2013.01)

(58) Field of Classification Search
CPC ........ H05K 1/09; H05K 1/032; H05K 1/0393; H05K 3/10; H05K 3/4664; H05K 3/1241; H05K 2201/0129; H05K 2201/0158; H05K 2203/0126; B33Y 70/00; B33Y 80/00; B29C 67/0055; B29C 67/0081; B29K 2023/0666; B29K 2031/3425
USPC ...................................... 427/97.3, 98.4, 356
See application file for complete search history.

(56) References Cited

U.S. PATENT DOCUMENTS

| | | |
|---|---|---|
| 4,755,911 A | 7/1988 | Suzuki |
| 4,772,509 A | 9/1988 | Komada et al. |

(Continued)

OTHER PUBLICATIONS

Mireles, Texas, Jorge, et al. "Fused Deposition Modeling of Metals" W. M. Keck Center for 3D Innovation, The University of Texas, Reviewed and Accepted Aug. 22, 2012 BNSDOCID: <XP_55280665A_I_<, pp. 836-845.

(Continued)

*Primary Examiner* — Brian K Talbot
(74) *Attorney, Agent, or Firm* — John A. Miller; Shumaker, Loop & Kendrick, LLP

(57) ABSTRACT

An electronic component, such as a circuit board, fabricated by coextruding an Ultra High Molecular Weight Polyethylene (UHMWPE) filament, such as a Dyneema® filament, and a conductive material, such as an Indalloy wire, using only a three-dimensional printer, such as an FDM machine.

15 Claims, 3 Drawing Sheets

(51) Int. Cl.
*H05K 3/12* (2006.01)
*B29K 23/00* (2006.01)
*B29K 305/00* (2006.01)
*B29L 31/34* (2006.01)

(56) References Cited

U.S. PATENT DOCUMENTS

| | | | | |
|---|---|---|---|---|
| 4,991,287 | A * | 2/1991 | Piatt | H05K 3/062 |
| | | | | 118/697 |
| 5,097,390 | A | 3/1992 | Gerrie et al. | |
| 5,183,701 | A | 2/1993 | Jacobs et al. | |
| 5,619,018 | A | 4/1997 | Rossi | |
| 5,972,484 | A * | 10/1999 | Cohen | B32B 27/02 |
| | | | | 174/254 |
| 6,085,957 | A * | 7/2000 | Zinniel | B65H 51/30 |
| | | | | 226/43 |
| 8,003,752 | B2 | 8/2011 | Smith et al. | |
| 8,827,684 | B1 * | 9/2014 | Schumacher | B29C 67/0055 |
| | | | | 264/308 |
| 2012/0068378 | A1 * | 3/2012 | Swanson | B29C 67/0055 |
| | | | | 264/308 |
| 2012/0243823 | A1 | 9/2012 | Giboney | |
| 2013/0170171 | A1 * | 7/2013 | Wicker | H01L 21/4846 |
| | | | | 361/809 |
| 2015/0077215 | A1 * | 3/2015 | Ranky | B29C 70/88 |
| | | | | 338/47 |
| 2016/0136887 | A1 * | 5/2016 | Guillemette | B29C 67/0055 |
| | | | | 428/375 |
| 2016/0198576 | A1 * | 7/2016 | Lewis | H01L 23/49822 |
| | | | | 361/761 |

OTHER PUBLICATIONS

Fang, L. M. "Temperature Window Effect and Its Application in Extrusion of Ultrahigh Molecular Weight Polyethylene" eXPRESS Polymer Letters, vol. 5, No. 8, pp. 2011, 674-684.

Comb, James W. "FDM Technology Process Improvements" Solid Freeform Fabrication Symposium, Proceedings, Aug. 8-10, 1994 pp. 42-55.

* cited by examiner

HIGH PERFORMANCE, ULTRA LOW LOSS, ULTRA LIGHTWEIGHT, MULTI-LAYERED RIGID CIRCUIT BOARDS

BACKGROUND

Field

This invention relates generally to a method for efficiently manufacturing high performance components using a three-dimensional printer and, more particularly, to a method that employs Dyneema®, an Ultra High Molecular Weight Polyethylene (UHMWPE), and Indalloy wire to efficiently create components, such as rigid circuit boards, using Fused Deposition Modeling (FDM).

Discussion

Circuit boards are costly and require multiple fabrication steps to manufacture. Many customers desire circuit boards with increased performance using next generation lightweight technologies that can reduce fabrication complexity, manufacturing costs, development costs, and production time. Known rigid circuit boards that are currently being fabricated often use polyimide or board materials manufactured by the Rogers Corporation, e.g., laminates with rolled copper. These known rigid circuit boards range in price from a few hundred dollars to several thousand dollars depending on the board complexity and the number of layers. Additionally, the lead time to manufacture custom circuit boards is in the range of weeks to months as a result of the many steps and special tooling required to make custom circuit boards.

Furthermore, the polyimide used in the known rigid circuit boards is relatively dense at 1.43 g/cm$^3$, which may lead to an increased electronics payload weight. FR4 glass epoxy is another known circuit board material and has an even higher density of 1.85 g/cm$^3$. Typically, providing circuit boards having a reduced component weight is of a significant value, thereby creating a need in the art for lighter electronic components.

A common method for fabricating circuit boards includes direct-write technology, which requires printing conductive inks onto a board substrate. Another common method for fabricating circuit boards includes placing copper traces into the substrate after the substrate has been fabricated, where a portion of the substrate is later removed to create a space for the copper traces. Thus, the production of the substrate material for the circuit board is separate from the direct-write trace printing or the insertion of the copper traces. This is particularly problematic for multi-layered circuit boards because of the many build steps of substrate production followed by direct-write trace printing, resulting in significant time and labor costs. For example, known multi-layered circuit boards are fabricated layer by layer, followed by a high temperature cure or autoclave cure, and then followed by the use of direct-write technology to print conductive inks or to lay down copper traces onto an existing substrate. Thus, fabrication of the substrate must be separate from the direct-write printing step. Additionally, conductive inks tend to be inferior due to their lack of desired conductivity. Thus, there is a need in the art for a process that reduces both cost and build time for rigid circuit boards, and that also maintains or increases performance of the circuit board.

The use of Ultra High Molecular Weight Polyethylene (UHMWPE) that is filled with one or more additives, such as Acrylonitrile-Butadiene-Styrene Copolymer (ABS), polycarbonate (PC), polyphenylsulfone (PPSF/PPSU) or similar additives, is a known technique to fabricate circuit board substrates, however, the requirement of the additive(s) takes away from the attractive properties of the UHMWPE. Thus, there is a need in the art for an efficient process of creating circuit boards using an UHMWPE that does not require the use of additives or any other substance to create the circuit board substrate.

SUMMARY OF THE INVENTION

An electronic component, such as a circuit board, fabricated by coextruding an Ultra High Molecular Weight Polyethylene (UHMWPE) filament, such as a Dyneema® filament, and a conductive material, such as an Indalloy wire, using only a three-dimensional printer, such as an FDM machine.

DETAILED DESCRIPTION OF THE EMBODIMENTS

The following discussion of the embodiments of the invention directed to a method for fabricating rigid circuit boards is merely exemplary in nature, and is in no way intended to limit the invention or its applications or uses. For example, while rigid circuit boards are used in the description herein, it is to be understood that any type of electronic component that needs to exhibit high performance, ultra low loss and ultra lightweight could be fabricated by the method of the invention.

As stated above, the use of Ultra High Molecular Weight Polyethylene (UHMWPE) for circuit boards is known, but requires additives, such as Acrylonitrile-Butadiene-Styrene (ABS). The present invention proposes a method that uses the Dyneema® version of UHMWPE without any modifications so that a rigid circuit board, for example, may be manufactured using one machine, such as a Fused Deposition Modeling (FDM) machine. Fused deposition modeling, also known as Fused Filament Fabrication (FFF) or Plastic Jet Printing (PJP), employs a nozzle that ejects molten materials to deposit the materials on a movable table in a controlled manner to create a desired shape. Presently no circuit boards are known that use a UHMWPE that is not altered with an additive, and no known circuit boards are made of Dyneema®. Dyneema® is a proprietary version of UHMWPE that has gone through a yarn drawing and heat treatment process such that the material can not only be used in an FDM machine, but also may be used in other three-dimensional printing machines so that the original properties of Dyneema® may be maintained in the resulting 3D printed object when used under certain conditions, as is described in more detail below.

Figure 1:
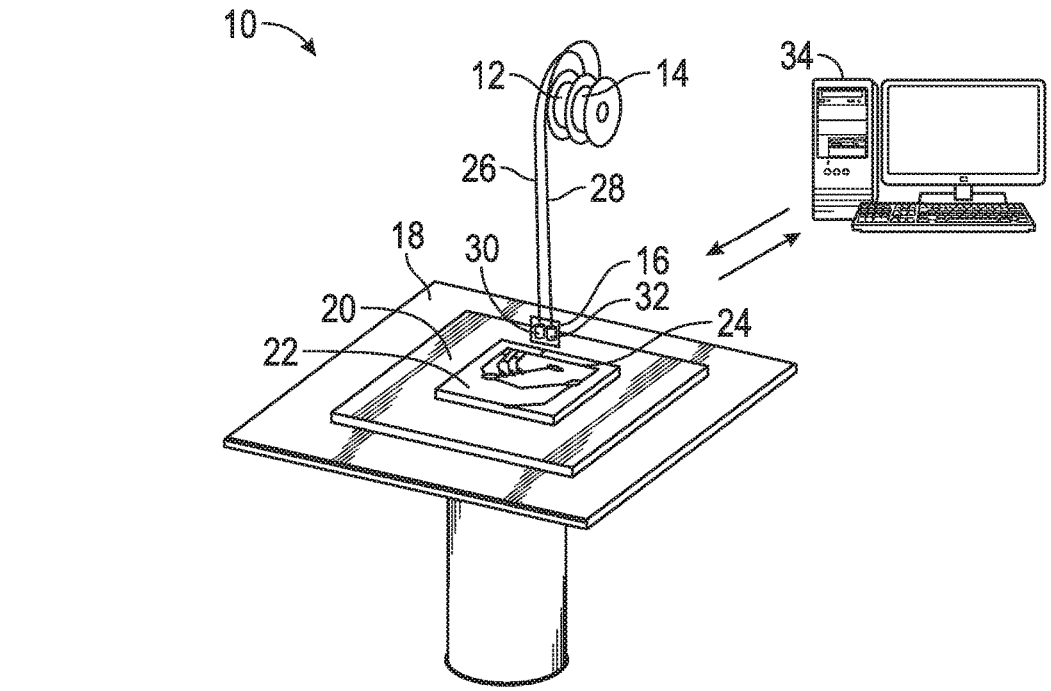
FIG. 1 is an isometric view of a dual head Fused Deposition Modeling (FDM) machine being used for fabricating a circuit board.

FIG. 1 is an isometric view of an FDM machine 10 for manufacturing a Dyneema® UHMWPE circuit board substrate 22 having an Indalloy circuit 24. To fabricate the substrate 22, a Dyneema® filament 26 from a spool 12 is fed into a first head 30 of a dual extrusion head and nozzle assembly 16, and a strand 28 of a conductive material, such as Indalloy 121 wire or any suitable solder that includes a conductive material, from a spool 14 is fed into a second head 32 of the assembly 16. While Dyneema® is available in sheet form and may be molded to create the circuit board substrate 22, such an approach would be more costly and time consuming than using the filament 26 because complex tooling would be required. Also, using Dyneema® in the FDM machine 10 does not require any tooling other than use of the machine 10. A build platform 18 having a base 20, such as a glass base, is positioned directly below the dual extrusion head and nozzle assembly 16. Using the building capabilities of the FDM machine 10 and an associated computing device 34 that is programmed to control the FDM machine 10 using certain parameters that are suitable for the Dyneema® filament 26 and the conductive material strand 28, a complete multi-layered circuit board, by way of example, may be created that is made up of only Dyneema® and the conductive material by coextruding the Dyneema® and the conductive material.

Dyneema® and Indalloy offer superior qualities for a circuit board. For example, when compared to other known circuit board materials, such as Rogers 4003 or Polyimide, Dyneema® provides the features of transparency, good RF properties, lower cost, lighter weight, and better mechanical and thermal properties. Indalloy wire has a relatively high tensile strength of 5.61 ksi, an elongation to break of 73%, a Brinell hardness of 40, and a density of 0.266 lbs/in$^3$ (copper has a density of 0.320 lbs/in$^3$). Indalloy 121 also has a thermal conductivity of 33 W/m-K (copper is 385 W/m-K), an electrical resistance of 0.0000110 ohm-cm (copper is 0.000000168 ohm-cm), and a melting temperature of 430° F. (copper is 1,981° F.). The large difference in the melting temperature between Indalloy and copper is important because Indalloy wire may be extruded using an FDM machine whereas copper wire cannot. Copper far exceeds the melting temperature capability of known FDM machines.

Figure 2:
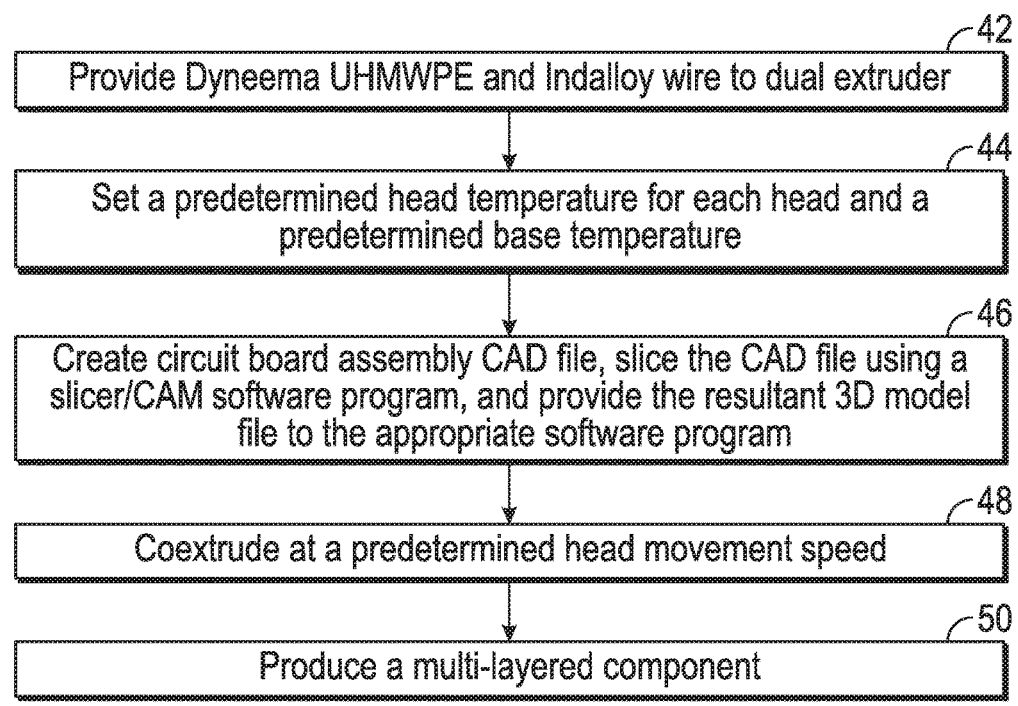
FIG. 2 is a flow diagram for producing a circuit board using the dual head FDM machine.

FIG. 2 is a flow diagram showing a process 40 for producing a circuit board using the dual head FDM machine 10 as described above. It is noted that although a dual head FDM machine is used in the exemplary process 40 of FIG. 2, any suitable three-dimensional printer may be used. Dyneema® and Indalloy wire are loaded onto the FDM machine 10 at box 42. For example, the Dyneema® filament 26 is fed into the first head 30 and the strand 28 is fed into the second head 32. At box 44, a predetermined head temperature is set for each head 30 and 32 of the dual extrusion head and nozzle assembly 16 using the computing device 34, where the temperature depends on the melting temperature of the materials used. For example, a temperature that is in the range of approximately 270°-290° F. may be set for the first head 30, and a temperature that is approximately 430° F. may be set for the second head 32. A base temperature that is in the range of approximately 270°-290° F. is also set for the base 20 of the FDM machine 10. A constant feed rate of the Dyneema® filament 26 and the Indalloy wire strand 28 is determined at the box 44 using the computing device 34 to maintain a consistent pressure.

Next, a circuit board assembly CAD file/model is created at box 46, and the CAD file/model is sliced using a slicer/CAM software program. The result of the sliced CAD file/model is a 3D model file, such as a .STL, .AMF, .STP, or .IGS file, is provided to the appropriate FDM software program of the computing device 34 at the box 46. Optimization and/or modification of a numerical control programming code/language, such as a G-code or .HPGL, that is produced by the slicer/CAM software program may be necessary to optimize the circuit board print/fabrication.

At box 48, the circuit board is created by coextruding the Dyneema® filament 26 and the Indalloy wire strand 28 at a predetermined head movement speed, where the Indalloy wire strand 28 is extruded into crevices that are designed into the substrate 22, thus secondary machining is not required. While the optimum head movement speed varies based on factors that include required precision and dimensional accuracies, the head movement speed is typically in a range that is approximately 20-80 mm/s. Using the layers that were defined in the slicer/CAM software and associated numerical control programming code/language at the box 46, a multi-layered component, e.g., a multi-layered circuit board, is fabricated at box 50. Thus, the complete manufacture of a multi-layered, high performance, rigid circuit board is provided using only the FDM machine 10 and predetermined print parameters so that the Dyneema® substrate/board material and Indalloy wire circuit material are the only materials in the finished product, i.e., no additives are used. Once the circuit board is completed and allowed to cool, the Dyneema® shrinks to hold the Indalloy circuit 24 in place and to seal the Indalloy circuit 24 therein. Using the process described above, a complete multi-layered circuit board may be fabricated in minutes to hours compared to the weeks or months necessary to fabricate known multi-layered circuit boards. Thus, a significant time and labor savings may be achieved using the process described above.

Rigid circuit boards that are made using the process and materials described above are not only produced more efficiently compared to known circuit boards, they are also of superior quality. Dyneema® has a loss tangent and a dielectric constant that are orders of magnitude lower than the known gold standard in the aerospace industry. Dyneema® outperforms known materials such as Astroquartz and Cyanate Ester resin by not only bringing higher RF performance for circuit board substrates, but also by reducing the weight of a typical circuit board, as Dyneema® has a density of 0.92 g/cm$^3$, making Dyneema® less dense than water (and therefore able to float in water). Dyneema® also has an extremely high specific tensile strength and specific tensile modulus, thereby outperforming current circuit board substrate materials and increasing the toughness of the finished product.

Figure 3:
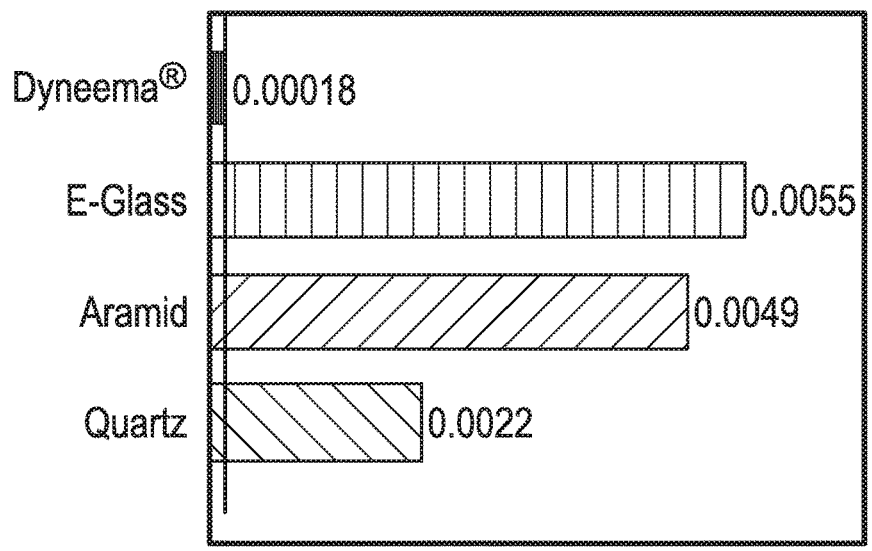
FIG. 3 is a bar graph that illustrates the loss tangent of Dyneema® compared to other materials.

FIG. 3 is a bar graph that illustrates the loss tangent of Dyneema® compared to other known circuit board materials, specifically E-glass, Aramid and Quartz. Dyneema® has a loss tangent of 0.00018 as compared to 0.0055 (E-glass), 0.0049 (Aramid) and 0.0022 (Quartz).

Figure 4:
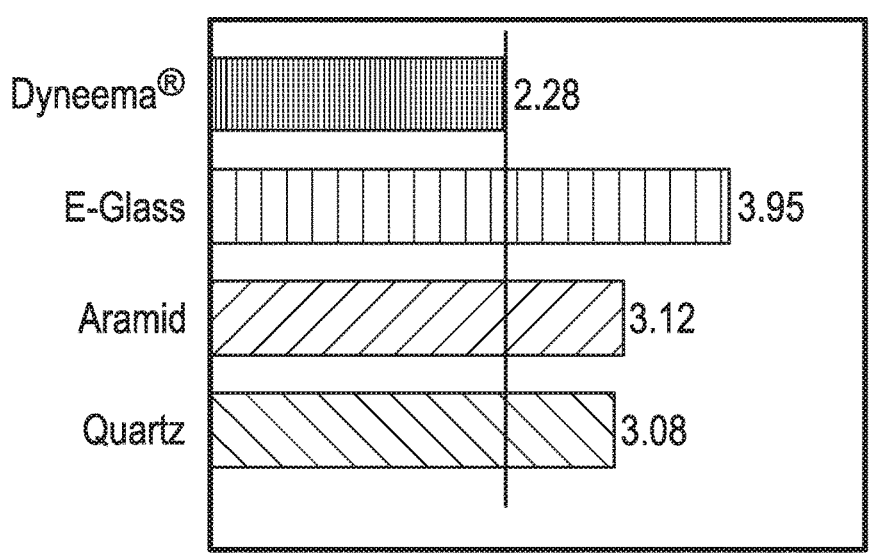
FIG. 4 is a bar graph that illustrates the dielectric constant of Dyneema® compared to other materials.

FIG. 4 is a bar graph that illustrates the dielectric constant of Dyneema® compared to the same known circuit board materials shown in FIG. 3. Dyneema® has a dielectric constant of 2.28 compared to 3.95 (E-glass), 3.12 (Aramid) and 3.08 (Quartz). With respect to mechanical properties, Dyneema® has superior specific tensile strength and specific tensile modulus compared to other known materials.

Figure 5:
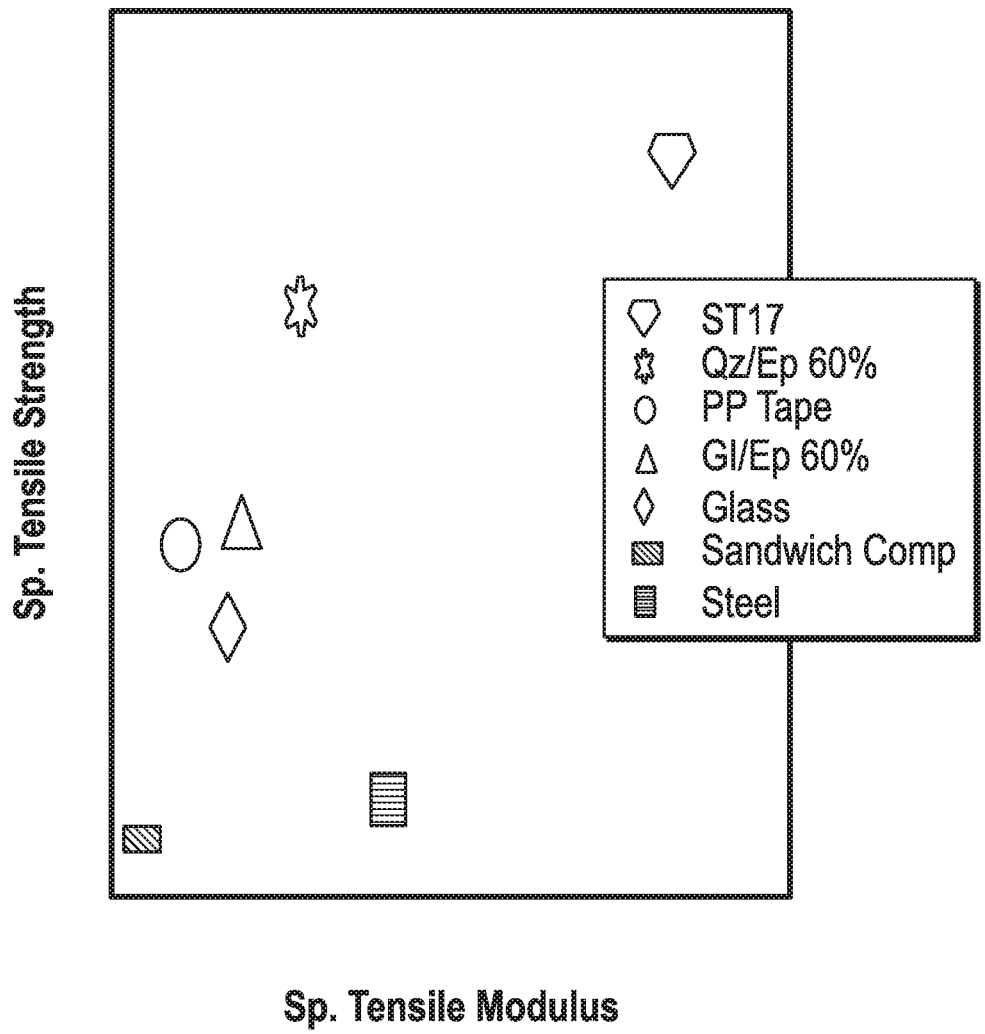
FIG. 5 is a graph with specific tensile modulus on the horizontal axis and specific tensile strength on the vertical axis that compares these properties of Dyneema® to other materials.

FIG. 5 is a graph with specific tensile modulus on the horizontal axis and specific tensile strength on the vertical axis showing that the circuit board made of Dyneema® and Indalloy wire has superior specific tensile modulus and specific tensile strength when compared to known circuit boards fabricated of different materials. Dyneema® (ST17) has the highest specific tensile strength and specific tensile modulus compared to Quartz/Epoxy (QZ/Ep 60%), polypropylene tape (PP Tape), Glass/Epoxy (Gl/Ep 60%), Glass, a Sandwich Composition and Steel.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for fabricating an electronic component made of only Dyneema® and Indalloy, said method comprising:
   providing a spool of a Dyneema® filament and a spool of an Indalloy wire on a Fused Deposition Modeling (FDM) machine;
   feeding the Dyneema® filament to a first head of the FDM machine;
   feeding the Indalloy wire to a second head of the FDM machine; and
   coextruding the Dyneema® filament and the Indalloy wire to fabricate the electronic component using the FDM machine wherein said Dyneema filament and Indalloy wire are utilized in the fabricated electronic component without any further additives.

2. The method according to claim 1 further comprising setting a head temperature for the first head in the range of 270°–290° F.

3. The method according to claim 1 further comprising setting a head temperature for the second head at approximately 430° F.

4. The method according to claim 1 further comprising setting a temperature for a base of the FDM machine in the range of 270°–290° F.

5. The method according to claim 1 wherein feeding the Dyneema® filament to a first head and feeding the Indalloy wire to a second head includes feeding the filament and the wire at a constant feed rate so that a consistent pressure is provided when fabricating the electronic component.

6. The method according to claim 1 further comprising programming a computing device for an electronic component assembly CAD file/model and slicing the CAD file/model using a slicer software program to create a 3D model file such that layers of the electronic component are defined for fabrication.

7. The method according to claim 6 wherein programming the computing device includes optimizing a numerical control programming code/language that is produced from the 3D model file.

8. The method according to claim 1 wherein coextruding the Dyneema® filament and the Indalloy wire includes using a head movement speed that is in the range of 20-80 mm/s.

9. A method for fabricating an electronic component, said method comprising:
   providing a first spool of an Ultra High Molecular Weight Polyethylene (UHMWPE) filament and a second spool of a circuit material on a three-dimensional printer;
   feeding the UHMWPE filament from the first spool to a first head of the three-dimensional printer;
   feeding the circuit material from the second spool to a second head of the three-dimensional printer;
   providing a computing device that is programmed to provide predetermined operating parameters for the three-dimensional printer; and
   coextruding the UHMWPE and the circuit material to fabricate an electronic component using the three-dimensional wherein said Ultra High Molecular Weight Polyethylene (UHMWPE) filament and circuit material are utilized in the fabricated electronic component without any further additives printer.

10. The method according to claim 9 wherein providing predetermined operating parameters of the three-dimensional printer includes providing a head temperature for the first head that is in the range of 270°–290° F.

11. The method according to claim 9 wherein providing predetermined operating parameters of the three-dimensional printer includes providing a head temperature for the second head that is approximately 430° F.

12. The method according to claim 9 wherein providing predetermined operating parameters of the three-dimensional printer includes providing a base temperature for a base of the three-dimensional printer that is in the range of 270°-290° F.

13. The method according to claim 9 wherein providing predetermined operating parameters of the three-dimensional printer includes providing a constant feed rate for the UHMWPE filament and the circuit material such that a consistent pressure is provided when fabricating the electronic component.

14. The method according to claim 9 wherein providing predetermined operating parameters of the three-dimensional printer includes optimizing a numerical control programming code/language of the three-dimensional printer.

15. The method according to claim 9 wherein the three-dimensional printer is a Fused Deposition Modeling (FDM) machine.

* * * * *